(12) United States Patent
Zhang et al.

(10) Patent No.: US 12,118,232 B2
(45) Date of Patent: Oct. 15, 2024

(54) MEMORY AND APPARATUS COMPRISING SAME

(71) Applicant: Anhui Cambricon Information Technology Co., Ltd., Anhui (CN)

(72) Inventors: Junwei Zhang, Anhui (CN); Jingye Xuan, Anhui (CN); Shangbin Chen, Anhui (CN)

(73) Assignee: Anhui Cambricon Information Technology Co., Ltd., Anhui (CN)

( * ) Notice: Subject to any disclaimer, the term of this patent is extended or adjusted under 35 U.S.C. 154(b) by 154 days.

(21) Appl. No.: 17/622,365

(22) PCT Filed: Nov. 5, 2020

(86) PCT No.: PCT/CN2020/126820
§ 371 (c)(1),
(2) Date: May 9, 2022

(87) PCT Pub. No.: WO2021/088933
PCT Pub. Date: May 14, 2021

(65) Prior Publication Data
US 2022/0365708 A1   Nov. 17, 2022

(30) Foreign Application Priority Data

Nov. 7, 2019  (CN) .......................... 201911083454.9

(51) Int. Cl.
*G06F 3/06*        (2006.01)
*G11C 7/10*        (2006.01)

(52) U.S. Cl.
CPC .......... *G06F 3/0655* (2013.01); *G06F 3/0673* (2013.01); *G11C 7/1045* (2013.01); *G11C 7/1084* (2013.01); *G11C 7/1063* (2013.01)

(58) Field of Classification Search
CPC .... G06F 3/0655; G06F 3/0673; G06F 15/781; G11C 7/1045; G11C 7/1084;
(Continued)

(56) References Cited

U.S. PATENT DOCUMENTS

2005/0212551 A1   9/2005   So et al.
2007/0126463 A1   6/2007   Cox et al.
(Continued)

FOREIGN PATENT DOCUMENTS

CN     103226383 A    7/2013
CN     105487944 A    4/2016
(Continued)

OTHER PUBLICATIONS

European Search Report For EP20885722. 7 issued on Jan. 2, 2024 from European patent office in a counterpart European patent application.
(Continued)

*Primary Examiner* — Jung Kim
(74) *Attorney, Agent, or Firm* — The PL Law Group, PLLC

(57) ABSTRACT

A memory is included in a combined processing apparatus which may include a computing device, a general interconnection interface, and another processing device. The computing device interacts with the other processing device to jointly complete a computing operation specified by a user. A storage device is respectively connected to the computing device and the other processing device, and is configured to store data of the computing device and the other processing device. The solution of the present disclosure can be widely applied to various data storage fields.

10 Claims, 11 Drawing Sheets

(58) Field of Classification Search
CPC ..... G11C 7/1063; G11C 7/1066; G11C 7/109; G11C 7/1093; G11C 7/1057; G11C 5/06; G11C 16/10
See application file for complete search history.

(56) References Cited

U.S. PATENT DOCUMENTS

2010/0077373 A1    3/2010   Isomura
2020/0202908 A1*   6/2020   Jung ................. G06F 13/1689

FOREIGN PATENT DOCUMENTS

| CN | 107844440 A | 3/2018 |
|---|---|---|
| KR | 10-2005-0095387 A | 9/2005 |
| KR | 10-2018-0130417 A | 12/2018 |

OTHER PUBLICATIONS

Office action issued on Feb. 20, 2024 from Korean Patent Office in a counterpart Korean Patent Application No. 10-2021-7042298 (all the cited references are listed in this IDS.) (English translation is also submitted herewith.).

* cited by examiner

MEMORY AND APPARATUS COMPRISING SAME

CROSS-REFERENCE TO RELATED APPLICATION

This application claims benefit under 35 U.S.C. 119, 120, 121, or 365(c), and is a National Stage entry from International Application No. PCT/CN2020/126820, filed. Nov. 5, 2020, which claims priority to the benefit of Chinese Patent Application No. 201911083454.9 filed in the Chinese Intellectual Property Office on Nov. 7, 2019, the entire contents of which are incorporated herein by reference.

BACKGROUND

1. Technical Field

The present application relates to the field of memories, and more specifically, relates to the field of DDR (Double Data Rate) memories.

2. Background of the Invention

In an on-die termination (ODT) control method of low power dual data rate (LPDDR4), there is a unique operation mode in which the ODT may be selected to be set to ON or OFF for an accessed die at the time of writing and an accessed system on chip (SOC) at the time of reading.

In the ODT control method of LPDDR5, however, there is a more flexible operation mode in which the ODT may be selected to be set to ON or OFF for either an accessed die or a non-accessed die at the time of writing. The more flexible operation mode is adopted mainly because: as the operating speed of LPDDR5 gradually increases to 6.4 Gbps, the signal integrity (SI) and the signal quality transmitted on the channel gradually degrade, and in order to obtain better signal quality, LPPDR is developed, so that in a dual-die architecture, the ODT may be selected to be set to ON or OFF for an accessed die and a non-accessed die respectively, and different values of the ODT can be set. However, this operation mode, which seems to solve the signal quality problem during the writing process, has the following disadvantage: while switching from write to read, the ODT cannot be set to OFF for the non-accessed die, which typically affects the signal quality during the reading process. Due to this disadvantage, the final setting method cannot use the ODT set value with the optimal signal quality, resulting in poor signal quality and little improvement in the operating speed.

SUMMARY

One object of the present disclosure is to solve the defect in the existing art that the data access speed in the memory cannot be further increased.

A first aspect of the present disclosure provides a memory, including: two dies D1, D2 with respective on-die terminations ODT1, ODT2, and a communication path is provided between the two dies D1, D2. One of the two dies is a target die T-D, and the on-die termination ODT1, ODT2 of the target die T-D are the target on-die termination T-ODT; the other is a non-target die NT-D, and the on-die termination OTD2, ODT1 of the non-target die NT-D are the non-target on-die termination NT-ODT; and an operation mode of the target die T-D includes a read mode and a write mode. The target die T-D sends a notification signal to the non-target die NT-D through the communication path to notify the non-target die NT-D of the operation mode of the target die T-D.

A second aspect of the present disclosure provides a package including a memory as described above. The communication path is provided inside the package and directly connected to the dies D1, D2.

A third aspect of the present disclosure provides a package including a memory as described above. An external terminal is provided outside the package, through which the communication path is connected to the dies D1, D2.

A fourth aspect of the present disclosure provides a processor system including a processor chip and the memory as described above. The processor chip is connected to the dies D1, D2. Depending on different operation modes of the target die T-D, the processor chip sets resistance values of the target on-die termination T-ODT and the non-target on-die termination NT-ODT, and/or an on-die termination of the processor chip.

A fifth aspect the present disclosure provides a board card, including: the memory as described above; or including the package as described above; or including the processor system as described above.

A sixth aspect the present disclosure provides an electronic apparatus, including: the memory as described above; or including the package as described above; or including the processor system as described above; or including the board card as described above.

A seventh aspect of the present disclosure provides a storage method performed on a memory. The memory includes two dies D1, D2 with respective on-die terminations ODT1, ODT2, and a communication path is provided between the two dies D1, D2. One of the two dies is a target die T-D, and the on-die termination ODT1, ODT2 of the target die T-D are the target on-die termination T-ODT; the other is a non-target die NT-D, and the on-die termination OTD2, ODT1 of the non-target die NT-D are the non-target on-die termination NT-ODT; and an operation mode of the target die T-D includes a read mode and a write mode. The method includes: sending a notification signal to the non-target die NT-D through the communication path to notify the non-target die NT-D of the operation mode of the target die T-D.

One beneficial effect of the technical solution of the disclosure is that the data transmission speed of the memory can be increased.

BRIEF DESCRIPTION OF THE DRAWINGS

The above and other objects, features and advantages of exemplary implementations of the present disclosure will become readily understandable by reading the following detailed description with reference to the accompanying drawings. In the accompanying drawings, several implementations of the present disclosure are illustrated by way of example but not limitation, and like or corresponding reference numerals indicate like or corresponding parts, in which.

DETAILED DESCRIPTION OF THE EMBODIMENT

The technical solutions in the embodiments of the present disclosure will be described clearly and completely below with reference to the accompanying drawings in the embodiments of the present disclosure. Obviously, the described embodiments are some but not all embodiments of the present disclosure. All other embodiments obtained by those skilled in the art based on the embodiments of the present disclosure without paying any creative effort shall be included in the protection scope of the present disclosure.

Figure 1A:
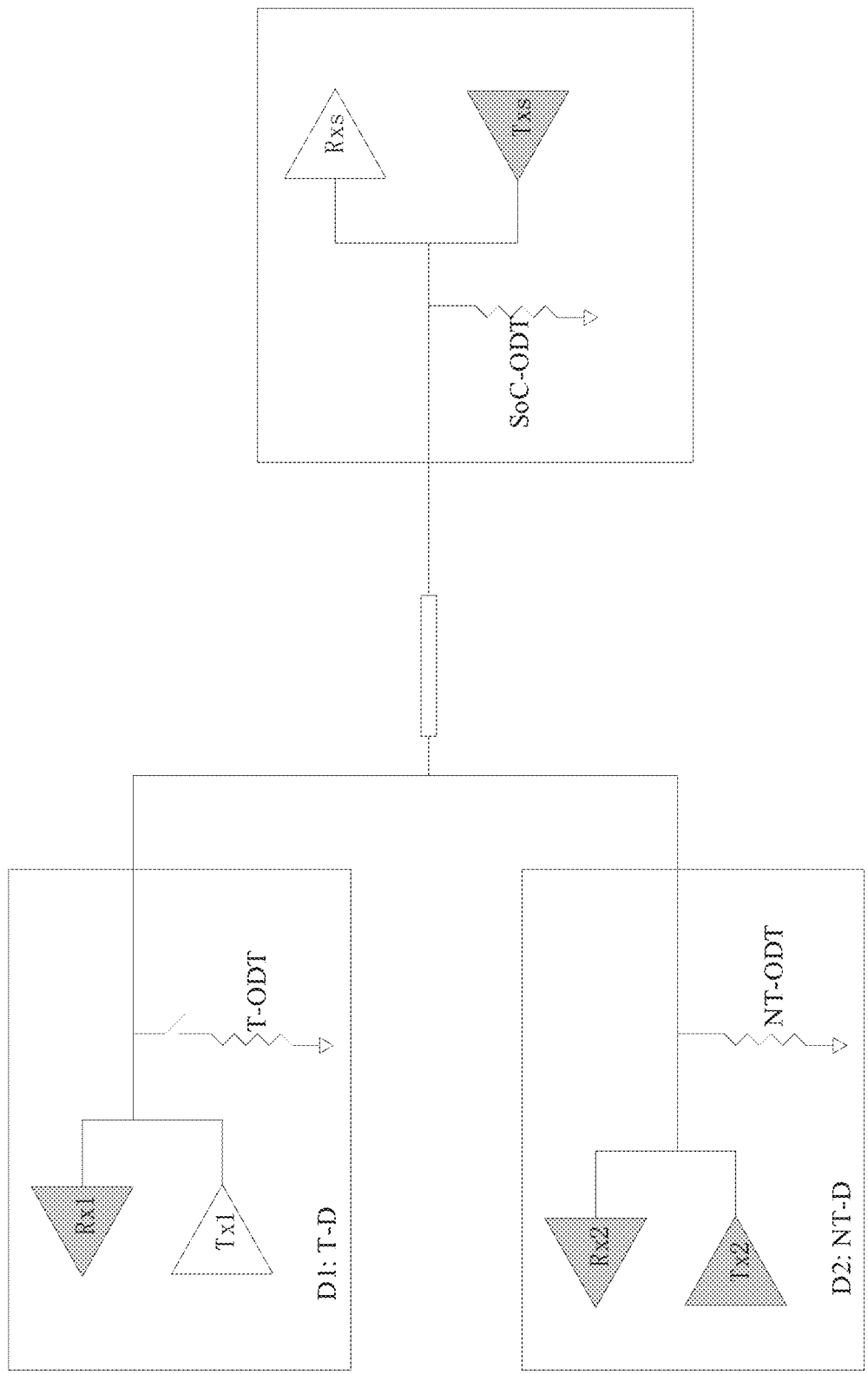
FIG. 1A shows basic configuration of a conventional LPDDR5 memory in a read mode.

FIG. 1A shows basic configuration of a conventional LPDDR5 memory in a read mode.

In FIG. 1A, a die D1 is in a working state, for example, in a read mode, and then the die D1 may be referred to as a target die T-D; while a die D2 is in a non-working state, and then the die D2 may be referred to as a non-target die NT-D. An SoC (System on a Chip) is correspondingly in a working state. It should be understood that the target die T-D and the non-target die NT-D may vary, and that the die D1 taken as the target die T-D and the die D2 taken as the non-target die NT-D are merely for exemplary purposes, but not intended to limit functionality of the dies D1 and D2 in any way.

In the read mode shown in FIG. 1A, a receiver terminal Rx1 in the target die T-D is in a non-working state, while a transmitter terminal Tx1 is in a working state. In FIG. 1A, to facilitate understanding and reading, an input terminal and an output terminal in the non-working state are represented in gray.

A transmitter terminal Txs in the SoC is in a non-working state, while a receiver terminal Rxs in the SoC is in a working state.

In the non-target die NT-D, both a transmitter terminal Tx2 and a receiver terminal Rx2 are in a non-working state.

As further shown in FIG. 1A, in the read mode, an on-die termination (referred to herein as T-ODT) in the target die T-D is set to OFF (which may also he understood as having an infinite resistance value), while an SoC-ODT in the SoC is in a working state.

Figure 1B:
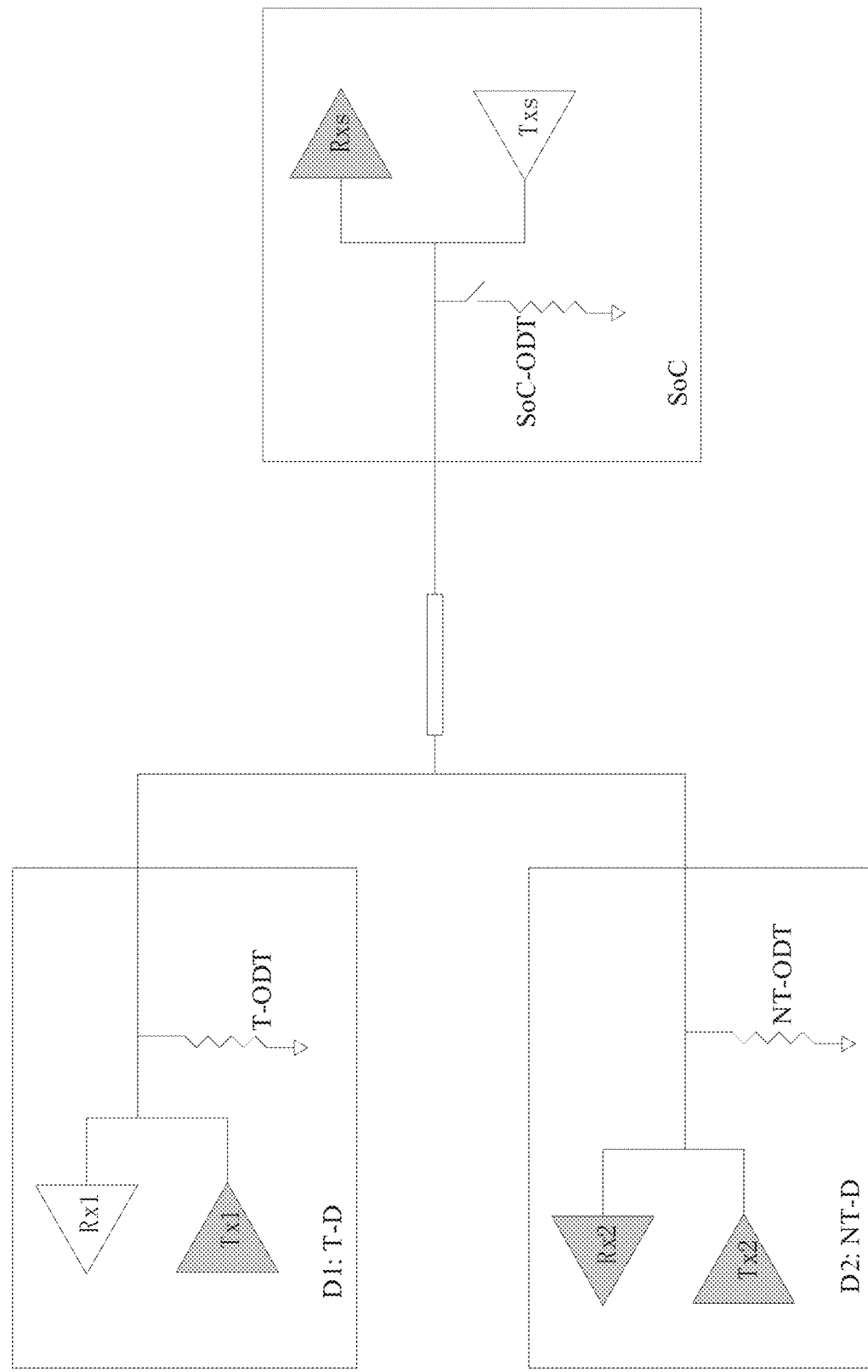
FIG. 1B shows basic configuration of a conventional LPDDR5 memory in a write mode.

FIG. 1B shows basic configuration of a conventional LPDDR5 memory in a write mode.

In FIG. 1B, the die D1 is in a working state, for example, in a write mode, and then the die D1 is stilled referred to as a target die T-D, while the die D2 is in a non-working state, and then the die D2 is referred to as a non-target die NT-D. The SoC is correspondingly in a working state.

In the write mode shown in FIG. 1B, the receiver terminal Rx1 in the target die T-D is in a working state, while the transmitter terminal Tx1 is in a non-working state. In FIG. 1B, to facilitate understanding and reading, the input terminal and the output terminal in the non-working state are also represented in gray.

A transmitter terminal Txs in the SoC is in a working state, while a receiver terminal Rxs in the SoC is in a non-working state.

In the non-target die NT-D, both a transmitter terminal Tx2 and a receiver terminal Rx2 are in a non-working state.

As further shown in FIG. 1B, in the write mode, the on-die termination (referred to herein as T-ODT) in the target die T-D is closed, while the SoC-ODT in the SoC is set to OFF and in a non-working state.

As can be seen from FIGS. 1A and 1B, since the operation mode of the target die T-D is not directly known to the non-target die NT-D, the non-target on-die termination NT-ODT does not change with the operation mode of the target die T-D. In other words, the non-target on-die termination NT-ODT of the non-target die NT-D does not change regardless of the target die T-D in the read mode or in the write mode.

Figure 2A:
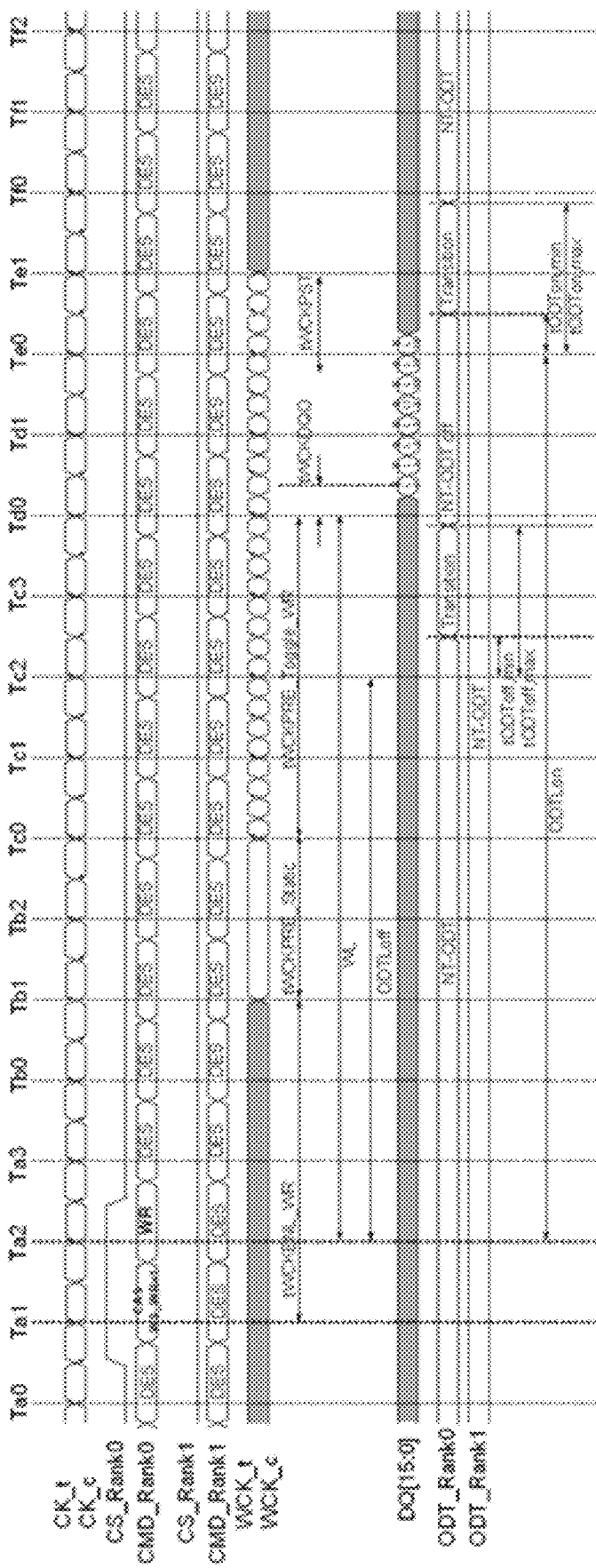
FIG. 2A shows a timing diagram of the write mode in the LPDDR5 specification (Item #1854.99A) according to the present disclosure.

FIG. 2A shows a timing diagram of the write mode in the LPDDR5 specification (Item #1854.99A) according to the present disclosure.

As shown in FIG. 2A (see also FIG. 164 of Item #1854.99A in the LPDDR5 specification), in a mode where the non-target ODT is enabled, the ODT timing (ODTLon and ODTLoff) is referenced to write latency (WL) after a write command, and an ODT value in the target die may be updated in a slot tODTon.max. After the write operation, the target ODT value should be restored to a preset, non-target ODT value in the slot tODToff.max.

Figure 2B:
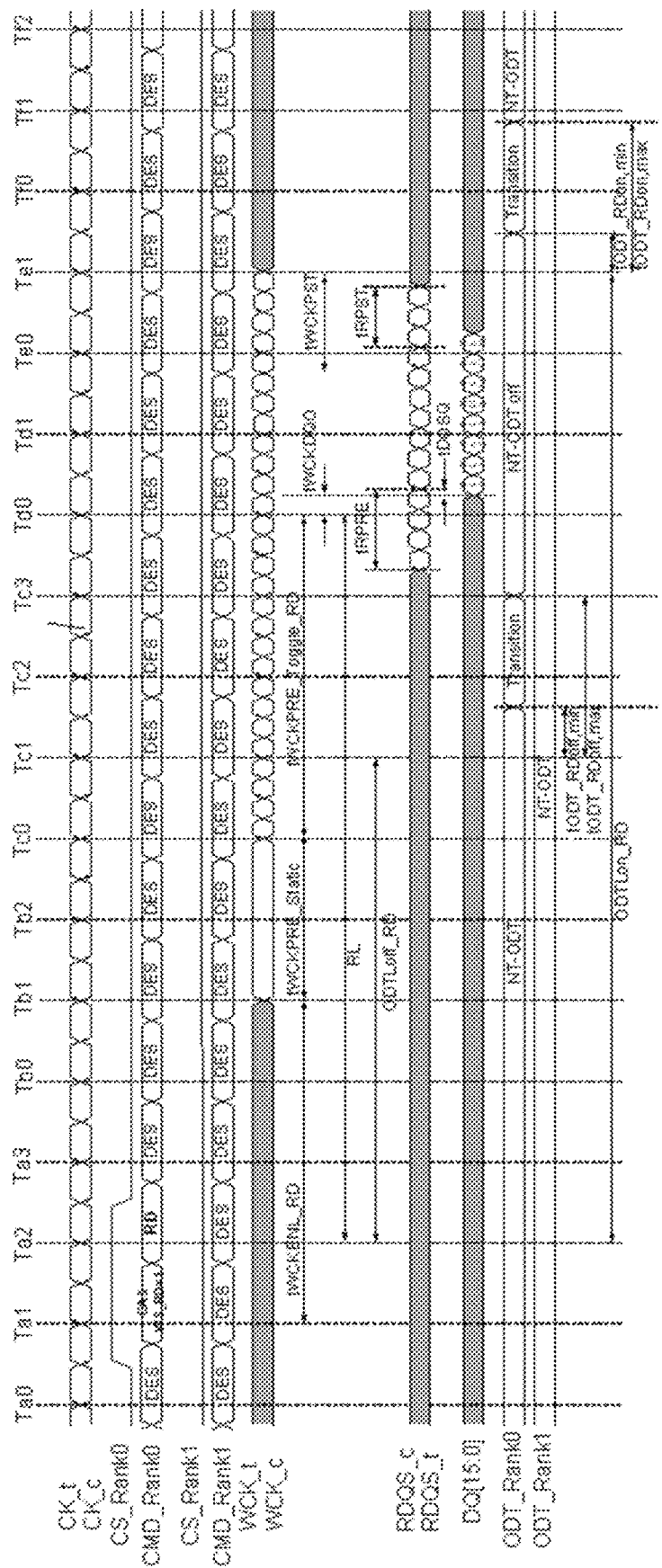
FIG. 2B shows a timing diagram of the read mode in the LPDDR5 specification (Item #1854.99A) according to the present disclosure.

FIG. 2B shows a timing diagram of the read mode in the LPDDR5 specification (Item #1854.99A) according to the present disclosure.

As shown in FIG. 2B (see also FIG. 165 of Item #1854.99A in the LPDDR5 specification), in a mode where the non-target ODT is enabled, the ODT timing (ODTLoff_RD/RD_DQ/RDQS) is referenced to read latency (RL) after a read command, and the ODT value in the target die may be disabled in a slot tODT_RDoff,max. After the read operation, the disabled ODT should be restored to a predetermined, non-target ODT value in the slot tODT_RDon, max.

In the above FIGS. 2A and 2B, ODT_Rank0 may represent the target on-die termination T-ODT of the target die T-D, while ODT_Rank1 may represent the non-target on-die termination NT-ODT of the non-target die NT-D. This will be further described below.

As can be seen from FIGS. 1A, 1B, 2A and 2B, in the LPDDR5 specification (Item #1854.99A), the non-target on-die termination NT-ODT in the non-target die NT-D remains in an activated state. In this case, there is no great influence when the data transmission is performed at a lower speed, but with increase of the data transmission speed, the influence of the non-target on-die termination NT-ODT in the non-target die NT-D gradually increases. In addition, in the existing specification, the target die T-D does not have any influence in the non-target die NT-D, and the non-target die NT-D cannot directly acquire the working state of the target die T-D.

Figure 3:
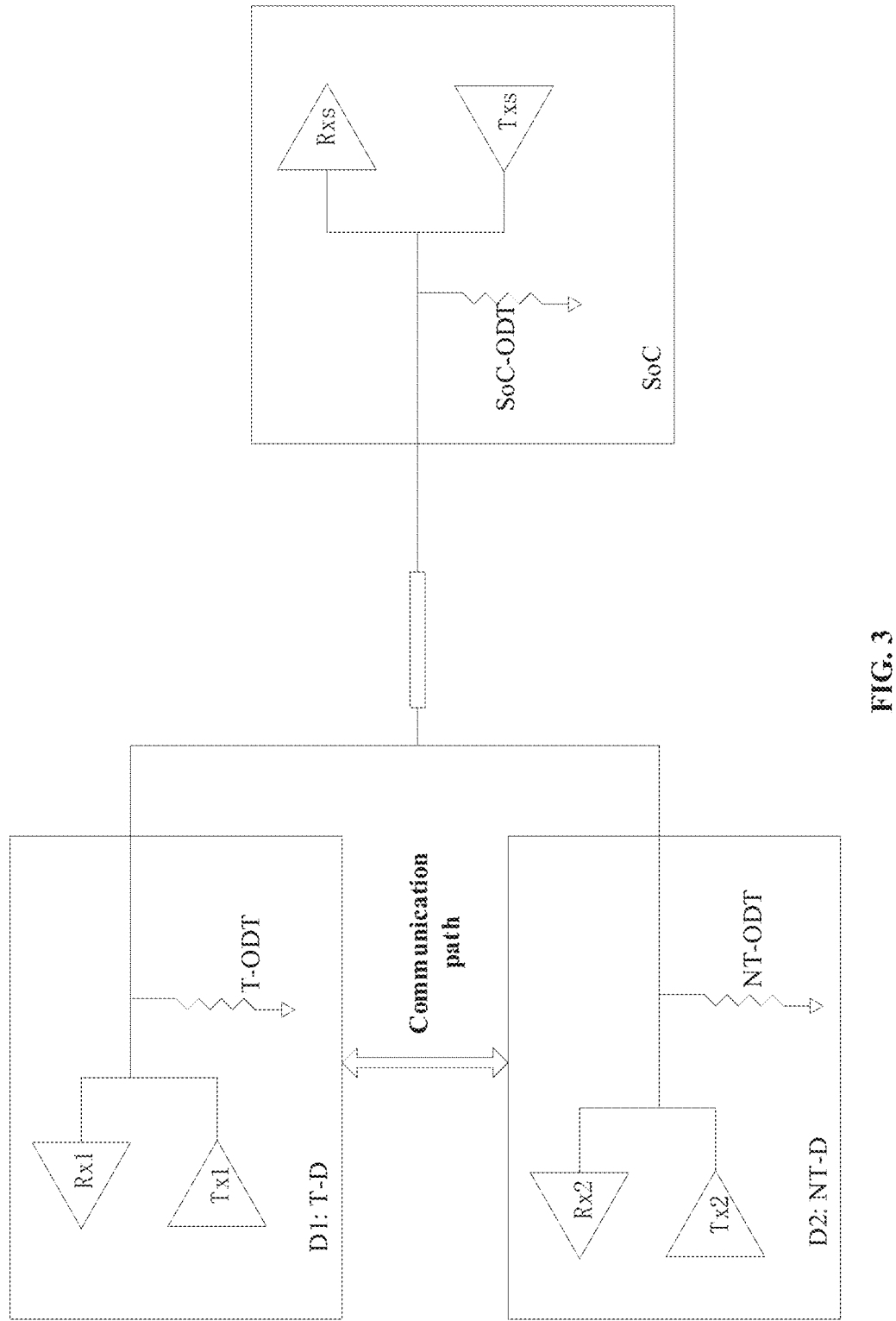
FIG. 3 shows a schematic diagram of a memory according to an aspect of the present disclosure.

FIG. 3 shows a schematic diagram of a memory according to an aspect of the present disclosure.

As shown in FIG. 3, an aspect of the present disclosure provides a memory, including two dies D1 and D2 with respective on-die terminations ODT1 and ODT2.

In FIG. 3, one of the two dies is a target die T-D (for example, the die D1 is the target die), and the on-die termination ODT1 of the target die T-D is a target on-die termination T-ODT the other is a non-target die NT-D (for example, the die D2 is a non-target die NT-D), and the on-die termination OTD2 of the non-target die NT-D is a non-target on-die termination NT-ODT; and an operation mode of the target die T-D may include a read mode and a write mode.

In FIG. 3, a communication path may be provided between the two dies D1 (also denoted as T-D in FIGS. 2A and 2B) and D2 (also denoted as NT-D in FIGS. 2A and 2B), through which the target die T-D may send a notification signal to the non-target die NT-D to notify the non-target die NT-D of the operation mode of the target die T-D.

In the structure shown in FIGS. 1A and 1B, the target die T-D and the non-target die NT-D are isolated from each other, and when the operation mode of the target die T-D is changed, the target die does not notify the non-target die NT-D, and the non-target die NT-D does not know the change in the operation mode of the target die T-D. As a result, the target die T-D and the non-target die NT-D cannot cooperate well with each other.

In contrast, in the structure shown in FIG. 3, since a communication path is provided between the target die T-D and the non-target die, when the operation mode of the target die T-D is changed, the target die T-D may send a notification signal to the non-target die NT-D through the communication path to notify the non-target die NT-D of the operation mode of the target die T-D, so that the non-target die NT-D may make corresponding settings.

Also exemplarily shown in FIG. 3 is an SoC chip including an SoC on-die termination SoC-ODT. The SoC, chip is connected to the dies D1, D2, and the SoC-ODT is set to different resistance values depending on different operation modes. It should be understood that although an SoC chip is shown in FIG. 3, it may alternatively be any processing unit with a control function, such as a CPU (Central Processing Unit) chip, a GPU (Graphics Processing Unit) chip, or the like.

Referring to the description of FIGS. 1A and 1B, the on-die termination in the target die T-D, T-ODT, may be set to OFF (infinite) in the read mode, and the on-die termination of the system on chip, SoC SoC-ODT, may be set to OFF (infinite) in the write mode.

According to an implementation of the present disclosure, the non-target die NT-D may be configured to, in response to receiving the notification signal from the target die T-D and depending on different operation modes of the target die T-D, set the non-target on-die termination NT-ODT to different resistance values.

The communication path will be described in detail with reference to the accompanying drawings.

Figure 4:
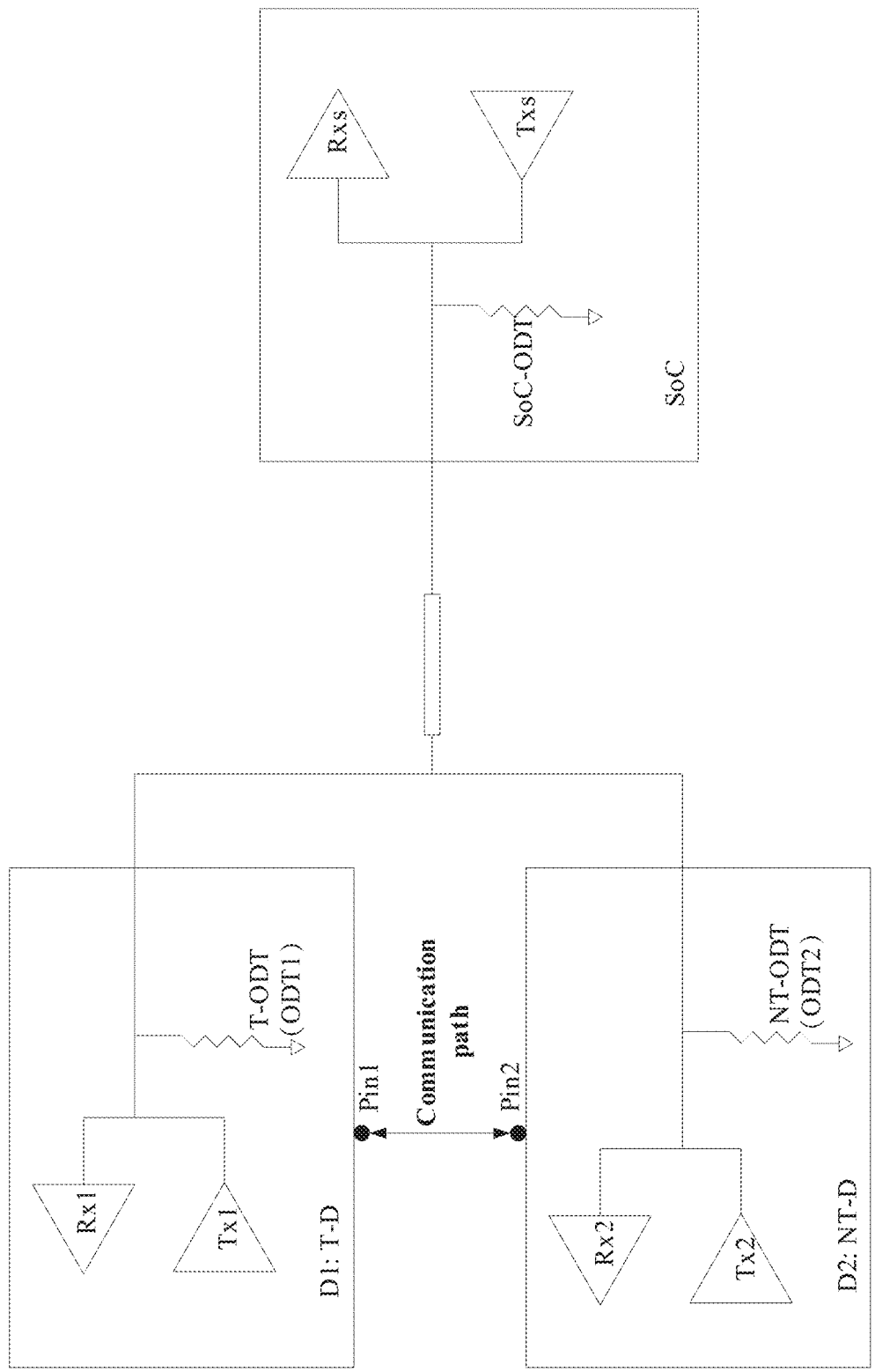
FIG. 4 shows a schematic diagram of a communication path according to an implementation of the present disclosure.

FIG. 4 shows a schematic diagram of a communication path according to an implementation of the present disclosure. According to this implementation, the communication path includes a single bidirectional communication path.

As shown in FIG. 4, a Pin1 and a Pin2 may be respectively provided in the dies D1 and D2, and directly connected through the bidirectional path. Here, Pin1 may be represented as ODT_Ctrl_Rank0, while Pin2 may be represented as ODT_Ctrl_Rank1, indicating that a notification signal or a control signal may be sent through the pin.

This has the beneficial effect that in a package including dies D1 and D2, there is no need to add any new connection point or terminal outside the package, thereby allowing minor modifications on the existing dies and specifications, and further reducing the cost. In addition, with the above implementation, only one pin is to be added to the original die, which reduces the complexity of modifying the die.

In addition, the single bidirectional communication path is beneficial to reducing the count of pins, thereby further reducing the manufacturing process and the chip area.

Figure 5:
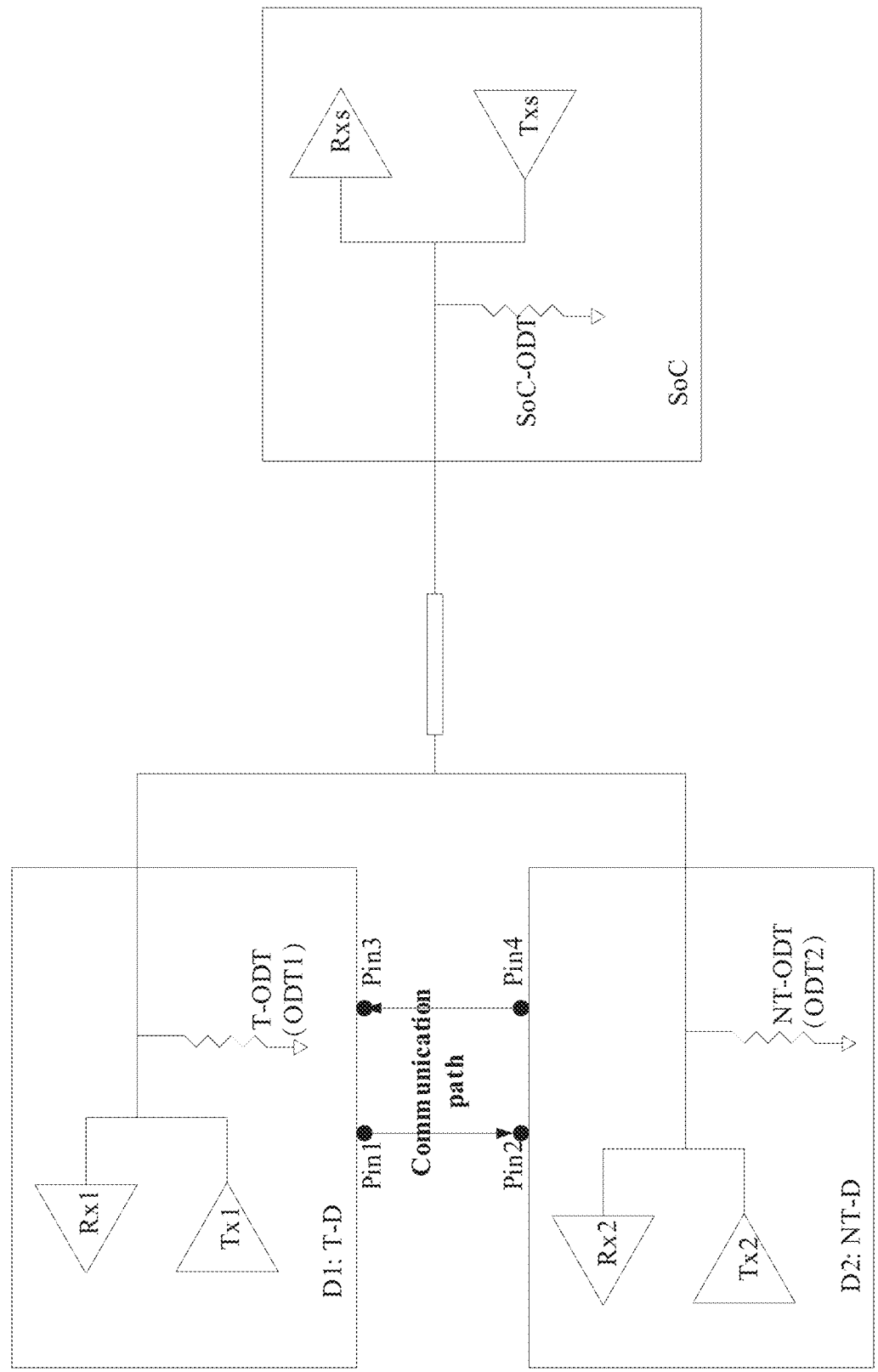
FIG. 5 shows a schematic diagram of a communication path according to another implementation of the present disclosure.

FIG. 5 shows a schematic diagram of a communication path according to another implementation of the present disclosure. According to this implementation, the communication path includes two opposite unidirectional communication paths.

As shown in FIG. 5, a Pin1 and a Pin3 may be respectively provided in the dies D1, and a Pin2 and a Pin4 may be respectively provided in the die D2. One communication path may be provided from Pin1 to Pin2, and another communication path may be provided from Pin4 to Pin3. Here, Pin1 may be represented as ODT_Ctrl_Rank0, while Pin2 may be represented as ODT_Ctrl_Rank1, indicating that a notification signal or a control signal may be sent through the pin.

This has the beneficial effect that in a package including dies D1 and D2, there is no need to add any new connection point or terminal outside the package, thereby allowing minor modifications on the existing dies and specifications, and further reducing the cost.

Further, with the two communication paths, transmission and reception of the notification signals may be isolated, which reduces or eliminates potential interference or collisions between the signals.

Figure 6:
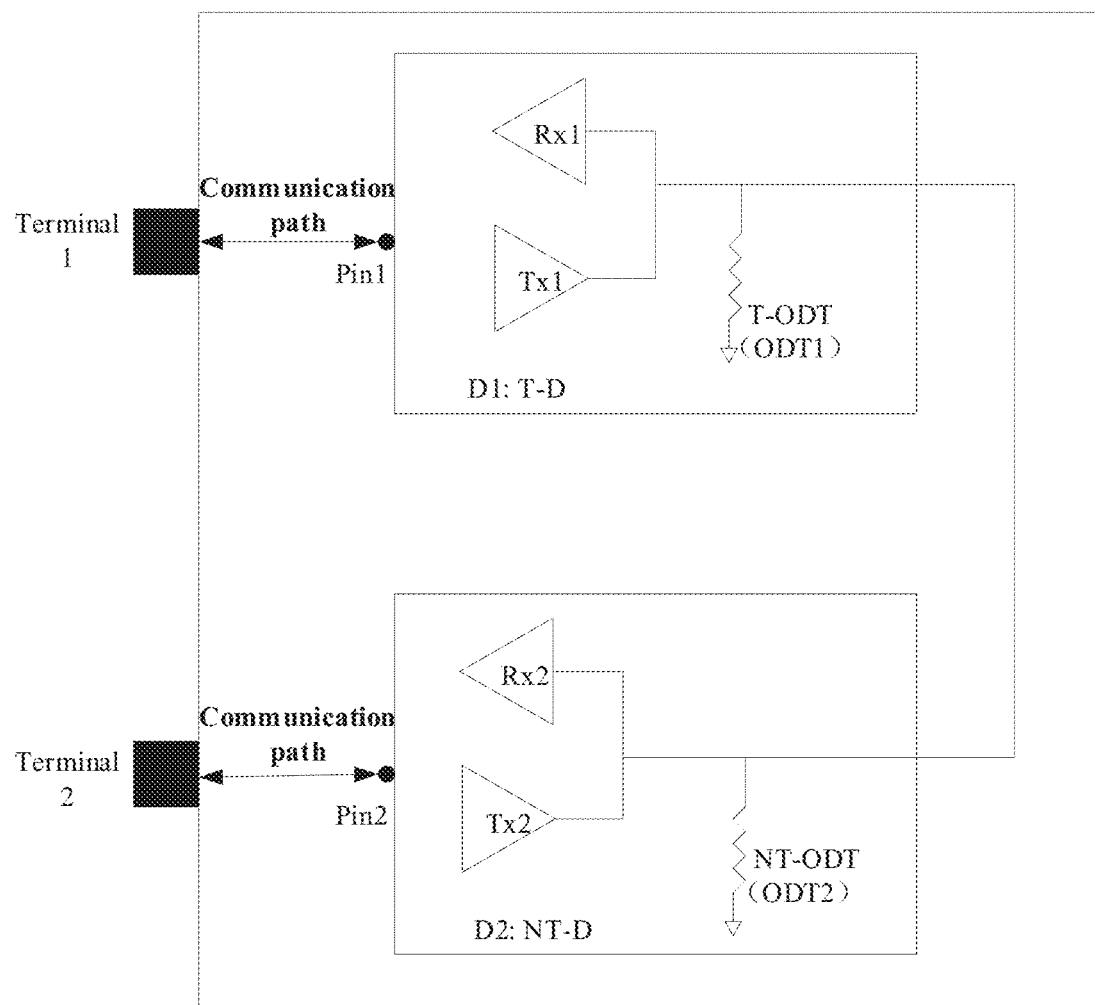
FIG. 6 shows a schematic diagram of a memory according to another implementation of the present disclosure.

FIG. 6 shows a schematic diagram of a memory according to another implementation of the present disclosure.

As shown in FIG. 6, the memory shown in FIGS. 1A to 5 is located in a package. In the implementation shown in FIG. 6, the SoC is omitted for convenience of explanation.

In this package, Pin1 of the die D1 is connected to a terminal 1 outside the package, and Pin2 of the die D2 is connected to a terminal 2 outside the package. The terminals 1 and 2 may be formed as separate connection terminals outside the package, so that a complete communication path may be formed when the terminals 1 and 2 are connected.

It should be understood that the arrangement in FIG. 6 is merely an example, and other counts of terminals outside the package may be provided. For example, one terminal may be provided outside the package, to which a bidirectional communication link is connected. In another example, two terminals may be provided outside the package, a unidirectional communication path from the die D1 to the die D2 passing through a first terminal, and a unidirectional communication path from the die D2 to the die D1 passing through a second terminal.

Further, similar to FIGS. 4 and 5, the pin or terminal starting from the die D1 may be represented as ODT_Ctrl_Rank0, while the pin or terminal from the die D2 may be represented as ODT_Ctrl_Rank1.

Although FIG. 3 does not indicate which transmitter terminals or receiver terminals are in a working state, which are in a non-working state, or which ODT is set to OFF as in FIGS. 1A and 1B, it should be understood by those skilled in the art that FIG. 3 merely shows a general connection state, and the specific working states of the components will be described in detail later.

The type of notification signal may be various. According to an implementation of the present disclosure, the notification signal may be a step signal that is sent in the read mode and includes a front step edge and a back step edge. The front step edge (e.g., a rising edge) of the step signal occurs before the start of data transmission in the read mode, and the back step edge (e.g., a falling edge) occurs after the end of data transmission in the read mode.

As can be seen from the timing diagrams of FIGS. 2A and 2B, switching from one mode to another and completing data transmission in another mode require a plurality of clock periods. As shown in FIG. 2A, the WR mode is entered between clock periods Ta2 and Ta3, and after several clock periods, data transmission is subsequently performed between clock periods Td0 and Te1. Therefore, the desired beneficial effects of the present disclosure may be achieved as long as the non-target on-die termination NT-ODT is set to a suitable resistance value prior to data transmission.

Figure 7:
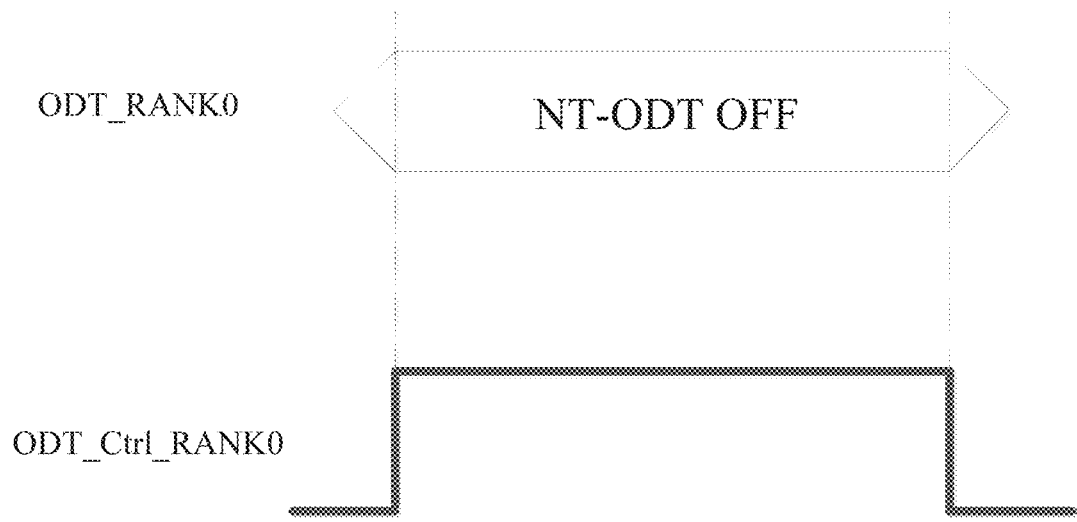
FIG. 7 shows a simple timing diagram for sending a notification signal according to an implementation of the present disclosure.

FIG. 7 shows a simple timing diagram for sending a notification signal according to an implementation of the present disclosure.

As shown in FIG. 7, the entire period of data transmission in DQ (15:0) is covered in the NT-GDT OFF clock period of ODT_Rank0. Thereby, before the start of the NT-ODT OFF clock period, a step signal may be sent through the pin ODT_Ctrl_Rank0, and at the rising edge of the step signal, the non-target on-die termination NT-ODT is notified to be set to a corresponding resistance value. Thereafter, ODT_Ctrl_Rank0 may remain at a higher (or lower) level during the NT-ODT OFF clock period. When the NT-ODT OFF period is ended, the step signal jumps from a higher level to a lower level, so that the resistance value of the non-target on-die termination NT-ODT can be restored to the previous setting.

In some embodiments, the step signal shown in FIG. 7 may occur during the NT-ODT OFF clock period of FIG. 2B, during which the NT-ODT may be set to OFF, and then restored to the previous setting after the end of the NT-ODT OFF clock period. This has the beneficial effect that the step signal may be set using the "NT-ODT OFF" clock period in the existing specification with little modification to the existing timing diagram.

Next, the target die T-D enters a write mode where no step signal is sent since the NT-ODT has been restored to the previous appropriate setting.

Optionally, the step signal may be sent in the write mode. The rising edge of the step signal may occur before the start of the NT-ODT OFF clock period of the write mode, and the falling edge may occur after the start of the NT-ODT OFF clock period of the write mode. Thereby the resistance value of the NT-ODT may be set to a desired threshold during the NT-ODT OFF clock period, and the NT-ODT may be set to OFF after the end of the NT-ODT OFF clock period.

Settings of the non-target on-die termination NT-ODT, as well as other on-die terminations, will be described in detail below in conjunction with tables.

Table 1 shows the data transmission performance in the read mode with different combinations of resistance values of the SoC on-die termination SoC-ODT and the non-target on-die termination NT-ODT. It will be understood that in the read mode, the target on-die termination T-ODT may be off (with an infinite resistance value); or the resistance value of the target on-die termination T-ODT is set to be large enough, so that the resistance value of the target on-die termination T-ODT is no less than the resistance value of the non-target on-die termination NT-ODT.

TABLE 1

| Read mode SoC-ODT/NT-ODT | 48/off EW(ps) | 60/120 EW(ps) | 80/80 EW(ps) | 120/60 EW(ps) | Off/48 EW(ps) |
| --- | --- | --- | --- | --- | --- |
| DQ0 | 65.1 | 64.4 | 63.7 | 60.7 | 44.2 |
| DQ1 | 64.8 | 62.3 | 64.3 | 63.5 | 38.7 |
| DQ2 | 71.6 | 72.9 | 70 | 64.3 | 16.8 |
| DQ3 | 60.2 | 57.8 | 55.8 | 50.1 | 34.4 |
| DQ4 | 67.3 | 64.5 | 58.7 | 54.7 | 33.8 |
| DQ5 | 62.7 | 62.8 | 58.5 | 55.7 | 23.8 |
| DQ6 | 75.7 | 78.8 | 73 | 67.4 | 25.6 |
| DQ7 | 70.7 | 69.3 | 69.1 | 66.5 | 35.1 |
| DM10 | 70.1 | 70.4 | 63.7 | 57.2 | 25.6 |
| RDQS_T | — | | | | |
| Average | 67.58 | 67.02 | 64.09 | 60.01 | 30.89 |

In table 1, EW represents the eye width, DQ0-DQ7, DM10, and RDQS_T represents the corresponding pins, respectively. As can be seen from table 1, in the read mode, when the SoC-ODT is 48 ohms and the non-target on-die termination NT-ODT is set to OFF, the average eye width is 67.58 ps; when the Soc-ODT is 60 ohms and the non-target on-die termination NT-ODT is 120 ohms, the average eye width is 67.02 ps; when the Soc-ODT is 80 ohms and the non-target on-die termination NT-ODT is 80 ohms, the average eye width is 64.09 ps; when the Soc-ODT is 120 ohms and the non-target on-die termination NT-ODT is 60 ohms, the average eye width is 60.01 ps; and when the Soc-ODT is set to OFF and the non-target on-die termination NT-ODT is 48 ohms, the average eye width is 30.89 ps.

As can be seen from table 1, in the read mode, in the case where the target on-die termination T-ODT is set to OFF, the smaller the ratio of SoC-ODT to the non-target on-die termination NT-ODT, the better the signal integrity (SI) or the signal quality, and as the resistance value of SoC-ODT gradually increases while the resistance value of the non-target on-die termination NT-ODT gradually decreases, the signal quality will gradually deteriorate, and seriously deteriorated when the SoC-ODT is set to OFF.

On the other hand, as can be seen from table 1, in the read mode, the resistance value of the non-target on-die termination NT-ODT may be set to be no less than 60 ohms, in which case although the signal quality still deteriorates, the degree of deterioration is within an acceptable range. In some embodiments, in the read mode, the non-target on-die termination (NT-ODT) may be set to OFF, in other words, having an infinite resistance value.

Table 2 shows the data transmission performance in the write mode with different combinations of resistance values of the target on-die termination T-ODT of the target die T-D and the non-target on-die termination NT-ODT. It will be understood that in the write mode, the SoC on-die termination SoC-ODT may be off (with an infinite resistance value), or the resistance value of the SoC on-die termination SoC-ODT is set to be large enough.

TABLE 2

| Write mode T-ODT/NT-ODT | 48/off EW(ps) | 60/120 EW(ps) | 80/80 EW(ps) | 120/60 EW(ps) | Off/48 EW(ps) |
| --- | --- | --- | --- | --- | --- |
| DQ0 | 65.2 | 68.9 | 73 | 86.8 | 103 |
| DQ1 | 65.8 | 70 | 75.5 | 87.2 | 92.1 |
| DQ2 | 70.6 | 71.4 | 76.3 | 79.5 | 81.8 |
| DQ3 | 59.6 | 62 | 62.5 | 77.4 | 83.9 |
| DQ4 | 64.1 | 65.3 | 61.7 | 74.4 | 87.2 |
| DQ5 | 67.8 | 68.4 | 72.9 | 78.3 | 89.9 |

TABLE 2-continued

| Write mode T-ODT/ NT-ODT | 48/off EW(ps) | 60/120 EW(ps) | 80/80 EW(ps) | 120/60 EW(ps) | Off/48 EW(ps) |
|---|---|---|---|---|---|
| DQ6 | 72 | 76.4 | 80.4 | 82.5 | 86.2 |
| DQ7 | 72.3 | 77.7 | 82.4 | 88 | 103 |
| DM10 | 60.8 | 63.2 | 68.2 | 73.9 | 78.3 |
| RDQS_T | 51.5 | 75.2 | 58.4 | 71.9 | 86.7 |
| Average | 64.97 | 69.85 | 71.13 | 79.99 | 89.21 |

As can be seen from table 2, in the write mode, when the T-ODT is 48 ohms and the non-target on-die termination NT-ODT is set to OFF, the average eye width is 64.97 ps; when the target on-die termination T-ODT is 60 ohms, and the non-target on-die termination NT-ODT is 120 ohms, the average eye width is 69.85 ps; when the target on-die termination T-ODT is 80 ohms, and the non-target on-die termination NT-ODT is 80 ohms, the average eye width is 71.13 ps; when the target on-die termination T-ODT is 120 ohms, and the non-target on-die termination NT-ODT is 60 ohms, the average eye width is 79.99 ps; and when the target on-die termination T-ODT is set to OFF and the non-target on-die termination NT-ODT is 48 ohms, the average eye width is 89.21 ps.

As can be seen from table 2, in the write mode, in the case where the SoC on-die termination SoC-ODT is set to OFF, the smaller the ratio of the target on-die termination T-ODT to the non-target on-die termination NT-ODT, the poorer the signal integrity (SI) or the signal quality, and as the resistance value of the target on-die termination T-ODT gradually increases while the resistance value of the non-target on-die termination NT-ODT gradually decreases, the signal quality will gradually get better; and when the target on-die termination T-ODT is set to OFF and the non-target on-die termination NT-ODT is 48 ohms, the optimal signal quality is achieved.

On the other hand, as can be seen from table 2, the resistance value of the non-target on-die termination NT-ODT may be set to be no greater than 120 ohms in the write mode. In this case, the signal quality, although not optimal, is still within an acceptable range. Therefore, in some embodiments, the target on-die termination T-ODT is set to OFF in the write mode.

Further, for the non-target on-die termination NT-ODT, the resistance value is set variously. For example, the resistance value may be set to be any value of 240/N ohms, where N is any integer from 2 to 10. In other words, the resistance value of the non-target on-die termination may be set to 120 ohms, 80 ohms, 60 ohms, 48 ohms, 40 ohms, 34 ohms, 30 ohms, 27 ohms, 24 ohms, etc.

It should be understood that the above resistance values are merely examples, and those skilled in the art may adopt other resistance values within the above resistance value intervals.

Table 3 shows the comparison of resistance values of the target on-die termination T-ODT, the non-target on-die termination NT-ODT, and the Soc on-die termination SoC-ODT according to an implementation of the present disclosure.

TABLE 3

| Operation mode | T-ODT | NT-ODT | SoC-ODT |
|---|---|---|---|
| Read mode | Off | Off | 48 ohm |
| Write mode | Off | 48 ohm | Off |

As can be seen from tables 1, 2 and 3, the target on-die termination T-ODT of the target die T-D, either in the read mode or in the write mode, may be set to be large enough, or set to OFF; the non-target on-die termination NT-ODT, in the read mode, may be set to be large enough, or set to OFF, and in the write mode, may be set to be smaller, or set to 48 ohms; the SoC on-die termination SoC-ODT, in the read mode, may be set to be smaller, or set to 48 ohms, and in the write mode, may be set to be large enough, or set to OFF.

According to an implementation of the present disclosure, the notification signal is sent after the target die T-D starts to switch the operation mode and before data is transmitted in the switched operation mode. In other words, according to the above implementation of the present disclosure, transmission of the notification signal from the target die T-D to the non-target die NT-D, either in the read mode or in the write mode, is required to be performed at least before the start of data transmission in the read mode or the write mode, so that the non-target die NT-D can complete the corresponding setting before the data, transmission, thereby facilitating the data transmission in the read mode or the write mode. It will be understood that the target on-die termination T-ODT of the target die T-D and the non-target on-die termination NT-ODT of the non-target die NT-D are switchable, and therefore, in order to facilitate mass production of the components and parts, the on-die terminations in the dies may be collectively set to a fixed value (e.g., 48 ohms), and then the resistance values of T-ODT and NT-ODT are controlled by opening and closing a switch. For example, the resistance values are infinite when the switch is open, and are 48 ohms when the switch is closed.

It should be further understood that 48 ohms is merely an exemplary resistance value, and those skilled in the art may employ any other suitable or prescribed resistance value in the LPDDR5 specification.

According to another implementation of the present disclosure, the memory may further include a mode register MR (not shown in the figures) in which a parameter list is stored, so that the memory is able to set at least the two dies D1, D2 according to the parameter list.

The parameter list may, for example, include states of the on-die termination in different operation modes, magnitudes of resistor values in different states, and events to occur under the respective clock signals, and the like. The mode register may be provided in the memory including the dies D1 and D2, or may be provided in each of the dies.

According to another implementation of the present disclosure, the memory may further include a memory controller that is connected to the two dies D1 and D2, and configured to control the resistance value of the target on-die termination T-ODT in the target die T-D. Optionally, the controller may be further configured to control the resistance value of the non-target on-die termination NT-ODT in the non-target die NT-D.

In this implementation, the target die T-D and the target on-die termination T-ODT therein may be controlled by an external memory controller. The memory controller may further control the non-target die NT-D and the non-target on-die termination NT-ODT therein, which facilitates the formation of a reliable backup in case of a failure of the communication path.

The memory controller may be separate or integrated into an external processor chip, such as a CPU chip, a GPU chip or an SoC chip.

The memory described above may be a low power dual data rate (LPDDR) memory, or may be any other memory that satisfies this architecture. Where the memory is an LPDDR memory, the memory controller may be a DDR controller.

Figure 8:
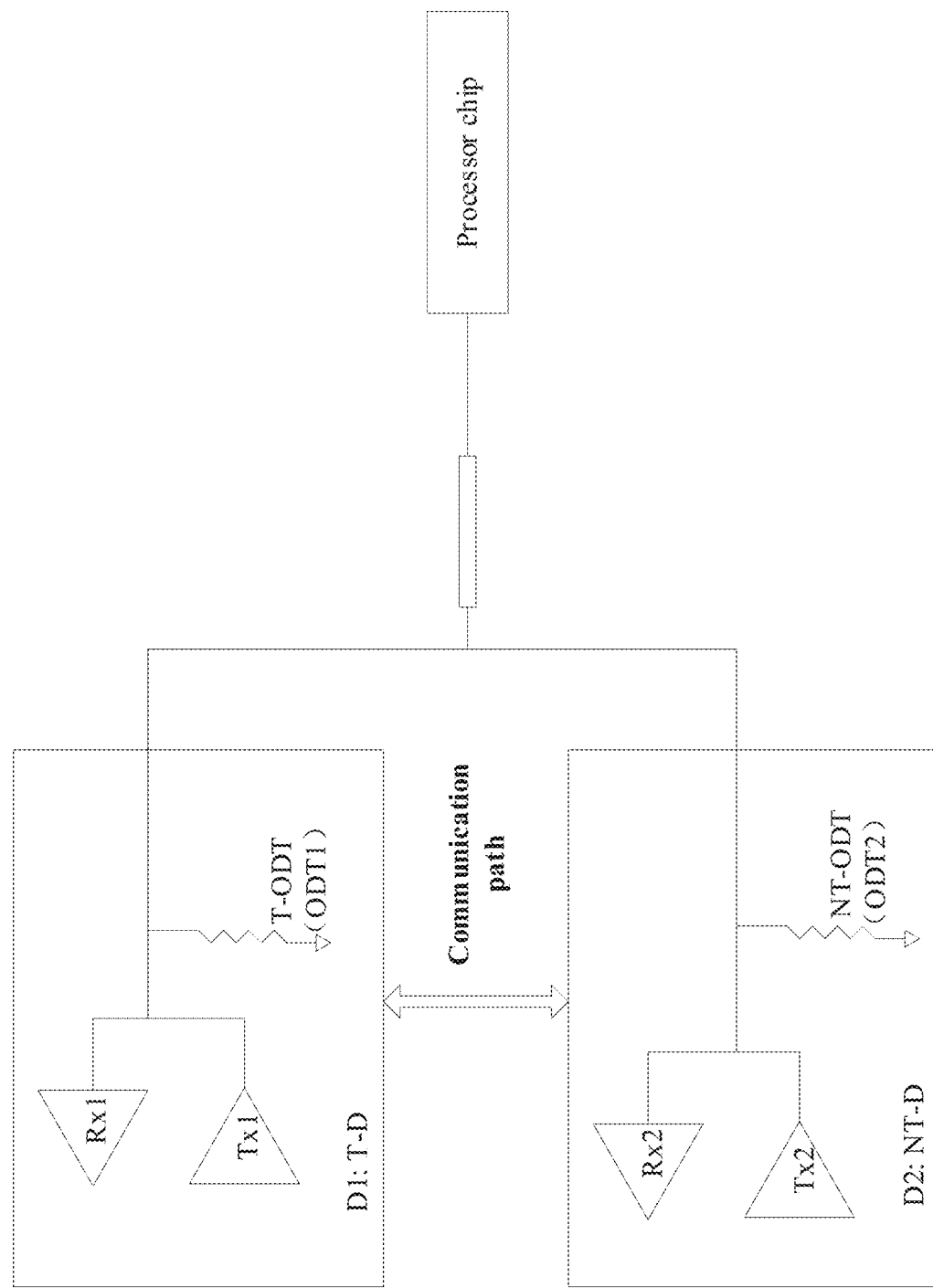
FIG. 8 shows a schematic block diagram of a processor system according to another implementation of the present disclosure.

FIG. 8 shows a schematic block diagram of a processor system according to another implementation of the present disclosure.

As shown in FIG. 8, the present disclosure further provides a processor system including a processor chip and the memory as described above. The processor chip is connected to the dies D1, D2. Depending on different operation modes of the target die T-D, the processor chip sets resistance values of the target on-die termination T-ODT and the non-target on-die termination NT-ODT, and/or an on-die termination of the processor chip.

The processor chip may include a CPU chip, a GPU chip, or an SoC chip or the like.

According to an implementation of the present disclosure, the on-die termination of the processor chip is set to be no greater than 120 ohms in the read mode.

According to an implementation of the present disclosure, the processor system is set to 240/N, where N is an integer between 2 and 10.

According to an implementation of the present disclosure, the on-die termination of the processor system is set to OFF in the write mode.

The present disclosure further provides a board card, including: the memory as described above; or including the package as described above; or including the processor system as described above.

The present disclosure further provides an electronic apparatus, including: the memory as described above; or including the package as described above; or including the processor system as described above; or including the board card as described above.

Figure 9:
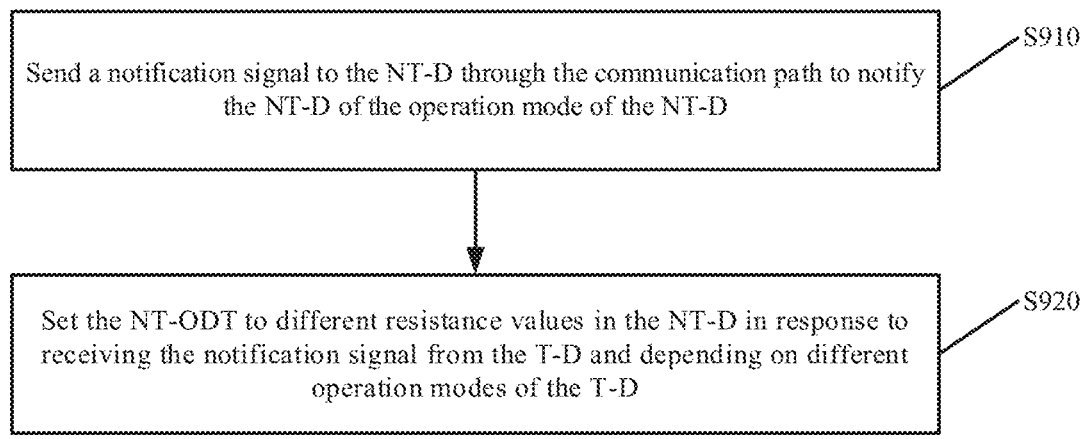
FIG. 9 shows a flowchart of a storage method performed on a memory according to another aspect of the disclosure.

FIG. 9 shows a flowchart of a storage method performed on a memory according to another aspect of the disclosure.

As shown in FIG. 9, the memory may include two dies D1, D2 with respective on-die terminations ODT1, ODT2, and a communication path is provided between the two dies D1, D2. One of the two dies is a target die T-D, and the on-die termination ODT1, ODT2 of the target die T-D are the target on-die termination T-ODT; the other is a non-target die NT-D, and the on-die termination OTD2, ODT1, of the non-target die NT-D are the non-target on-die termination NT-ODT; and an operation mode of the target die T-D includes a read mode and a write mode. The method may include: in operation S910, sending a notification signal to the non-target die NT-D through the communication path to notify the non-target die NT-D of the operation mode of the target die T-D.

According to another implementation of the present disclosure, the storage method may further include: in operation S920, setting the non-target on-die termination NT-ODT to different resistance values in the non-target die NT-D in response to receiving the notification signal from the target die T-D and depending on different operation modes of the target die T-D.

Other operation steps of the storage method of the present disclosure may be obtained by combining the description of FIGS. 1A to 8, which will not be repeated here.

Figure 10:
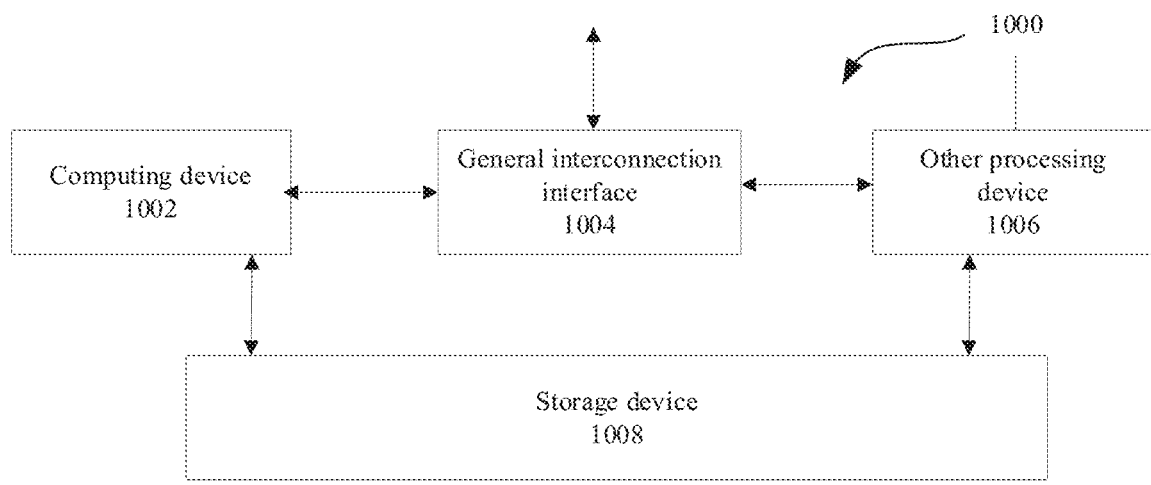
FIG. 10 is a schematic diagram of a combined processing apparatus according to an aspect of the present disclosure.

FIG. 10 further discloses a combined processing apparatus 1000 to describe a specific application scenario for the memory of the present disclosure. The combined processing apparatus 1000 may include a computing device 1002, a general interconnection interface 1004, another processing device 1006, and a storage device 1008 which may be or include the memory as described above. The computing device may interact with the other processing device to jointly complete an operation specified by a user.

The other processing device may include one or more types of general/dedicated processors such as CPUs, GPUs, neural network processors, and the like. The count of processors included in the other processing device is not limited. The other processing device may be used as an interface between a machine learning computation device and external data and control, including basic control such as data transfer, starting and stopping of the machine learning computation device, and the like; or the other processing device may cooperate with the machine learning computation device to perform computation tasks.

The general interconnection interface may be configured to transmit data and control instructions between the computing device (including, for example, a machine learning computation device) and the other processing device. The computing device may acquire the required input data from the other processing device, and write the input data into a storage device on chip of the computing device; or may acquire control instructions from the other processing device, and write the control instructions into a control cache on chip of the computing device; or may read data from a storage unit of the computing device and transmit the data to the other processing device.

The storage device 1008 may be connected to the computing device and the other processing device, respectively. The storage device 1008 may be configured to store data of the computing device and the other processing device, and is specifically suitable for the case where the required computation data cannot be stored entirely in an internal memory of the computing device or the other processing device.

The combined processing apparatus may be used as an SoC of an apparatus such as a mobile phone, a robot, a drone, a video monitoring device or the like, which can effectively reduce a core area of the control part improve the processing speed, and reduce the overall power consumption, in this case, the general interconnection interface of the combined processing apparatus may be connected to some component of the apparatus. Some component may include, for example, a camera, a monitor, a mouse, a keyboard, a network card, or a Wi-Fi interface.

In some embodiments, the disclosure further provides a chip including the storage device or combined processing apparatus as described above.

In some embodiments, the disclosure further provides a chip package structure including the chip as described above.

In some embodiments, the disclosure further provides an electronic apparatus or device including the memory described in the present disclosure.

The electronic apparatus or device may include a data processing device, a robot, a compute printer, a scanner, a tablet, a smart terminal, a cell phone, a drive recorder, a navigator, a sensor, a camera, a server, a cloud server, a video camera, a projector, a watch, headsets, a removable storage, a wearable device, vehicle, a household appliance, and/or a medical device.

The vehicle may include an airplane, a ship, and/or an automobile; the household appliance may include a television, an air conditioner, a microwave oven, refrigerator, an electric cooker, a humidifier, a washing machine, an electric lamp, a gas stove or a range hood; and the medical device may include a nuclear magnetic resonance instrument, a B ultrasonic scanner and/or an electrocardiograph.

Better understanding of the present disclosure may be obtained in light of the following clauses.

Clause A1. A memory, comprising: two dies (D1, D2) with respective on-die terminations (ODT1, ODT2), where a communication path is provided between the two dies (D1, D2), one of the two dies is a target die (T-D), and the on-die termination (ODT1, ODT2) of the target die (T-D) are a target on-die termination (T-ODT); the other is a non-target die (NT-D), and the on-die termination (OTD2, ODT1) of the non-target die (NT-D) are a non-target on-die termination (NT-ODT); and an operation mode of the target die (T-D) includes a read mode and a write mode; and the target die (T-D) sends a notification signal to the non-target die (NT-D) through the communication path to notify the non-target die (NT-D) of the operation mode of the target die (T-D).

Clause A2. The memory of clause A1, wherein the non-target die (NT-D) is configured to, in response to receiving the notification signal from the target die (T-D) and depending on different operation modes of the target die (T-D), set the non-target on-die termination (NT-ODT) to different resistance values.

Clause A3. The memory of clause A1 or A2, wherein the notification signal is a step signal including a front step edge and a back step edge, the step signal is sent in the read mode, in which the front step edge of the step signal occurs before the start of data transmission in the read mode of the target die (T-D), and the back step edge occurs after the end of data transmission in the read mode of the target die (T-D).

Clause A4. The memory of any one of clauses A1 to A3, wherein a resistance value of the target on-die termination (T-ODT) is set to be no less than a resistance value of the non-target on-die termination (NT-ODT).

Clause A5. The memory of any one of clauses A1 to A4, wherein the target on-die termination (T-ODT) is set to OFF.

Clause A6. The memory of any one of clauses A1 to A5, wherein the resistance value of the non-target on-die termination (NT-ODT) is set to be no less than 60 ohms in the read mode.

Clause A7. The memory of any one of clauses A1 to A6, wherein the non-target on-die termination (NT-ODT) is set to OFF in the read mode.

Clause A8. The memory of any one of clauses A1 to A7, wherein the resistance value of the non-target on-die termination (NT-ODT) is set to be no greater than 120 ohms in the write mode.

Clause A9. The memory of any one of clauses A1 to A8, wherein the resistance value of the non-target on-die termination (NT-ODT) is set to be any value of 240/N ohms, where N is any integer from 2 to 10.

Clause A10. The memory of any one of clauses A1 to A9, wherein the communication path includes a single bidirectional communication path.

Clause A11. The memory of any one of clauses A1 to A10, wherein the communication path includes two opposite unidirectional communication paths.

Clause A12. The memory of any one of clauses A1 to A11, further comprising a mode register (MR) in which a parameter list is stored so that the memory is able to set at least the two dies (D1, D2) according to the parameter list.

Clause A13. The memory of any one of clauses A1 to A12, further comprising a memory controller that is connected to the two dies (D1, D2) and configured to control the resistance value of the target on-die termination (T-ODT) in the target die (T-D).

Clause A14. The memory of any one of clauses A1 to A13, wherein the controller is further configured to control the resistance value of the non-target on-die termination (NT-ODT) in the non-target die (NT-D).

Clause A15. The memory of any one of clauses A1 to A14, wherein the memory is a low power dual data rate (LPDDR) memory.

Clause A16. A package, comprising the memory of any one of clauses A1 to A15, wherein the communication path is provided inside the package and directly connected to the dies (D1, D2).

Clause A17. A package, comprising the memory of any one of clauses A1 to A15, wherein an external terminal is provided outside the package, through which the communication path is connected to the dies (D1, D2).

Clause A18. A processor system, comprising a processor chip and the memory of any one of clauses A1 to A15, in which the processor chip is connected to the dies (D1, D2), wherein depending on different operation modes of the target die (T-D), the processor chip sets resistance values of the target on-die termination (T-ODT) and the non-target on-die termination (NT-ODT), and/or an on-die termination of the processor chip.

Clause A19. The processor system of clause A18, wherein the processor chip includes a CPU chip, a GPU chip, or an SoC chip.

Clause A20. The processor system of clause A18 or A19, wherein the on-die termination of the processor chip is set to be no greater than 120 ohms in a read mode.

Clause A21. The processor system of any one of clauses A18 to A20, wherein the processor system is set to 240/N, where N is an integer between 2 and 10.

Clause A22. The processor system of any one of clauses A18 to A21, wherein an on-die termination of the processor system is set to OFF in a write mode.

Clause A23. A board card, comprising: the memory of an one of clauses A1 to A15; or the package of clause A16 or A17; or the processor system of any one of clauses A19 to A23.

Clause A24. An electronic apparatus, comprising: the memory of any one of clauses A1 to A15; or the package of clause A16 or A17; or the processor system of any one of clauses A18 to A22; or the board card of clause A23.

Clause A25. A storage method performed on a memory, wherein the memory comprises two dies (D1, D2) with respective on-die terminations (ODT1, ODT2), and a communication path is provided between the two dies (D1, D2); wherein one of the two dies is a target die (T-D), and the on-die termination (ODT1, ODT2) of the target die (T-D) are a target on-die termination (T-ODT); the other is a non-target die (NT-D), and the on-die termination (OTD2, ODT1) of the non-target die (NT-D) are a non-target on-die termination (NT-ODT); and an operation mode of the target die (T-D) includes a read mode and a write mode; and the method comprises: sending a notification signal to the non-target die (NT-D) through the communication path to notify the non-target die (NT-D) of the operation mode of the target die (T-D).

Clause A26. The storage method of clause A25, wherein in response to receiving the notification signal from the target die (T-D) and depending on different operation modes of the target die (T-D), the non-target die (NT-D) sets the non-target on-die termination (NT-ODT) to different resistance values.

Clause A27. The storage method of clause A25 or A26, wherein the notification signal is a step signal including a front step edge and a back step edge, the step signal is sent in the read mode, in which the front step edge of the step signal occurs before the start of data transmission in the read mode of the target die (T-D), and the back step edge occurs after the end of data transmission in the read mode of the target die (T-D).

Clause A28. The storage method of any one of clauses A25 to A27, wherein a resistance value of the target on-die termination (T-ODT) is set to be no less than a resistance value of the non-target on-die termination (NT-ODT).

Clause A29. The storage method of any one of clauses A25 to A28, wherein the target on-die termination (T-ODT) is set to OFF.

Clause A30. The storage method of any one of clauses A25 to A29, wherein the resistance value of the non-target on-die termination (NT-ODT) is set to be no less than 60 ohms in the read mode.

Clause A31. The storage method of any one of clauses A25 to A30, wherein the non-target on-die termination (NT-ODT) is set to OFF in the read mode.

Clause A32. The storage method of any one of clauses A25 to A31, wherein the resistance value of the non-target on-die termination (NT-DDT) is set to be no greater than 120 ohms in the write mode.

Clause A33. The storage method of any one of clauses A25 to A32, wherein the resistance value of the non-target on-die termination (NT-ODT) is set to be any value of 240/N ohms, where N is any integer from 2 to 10.

Clause A34. The storage method of any one of clauses A25 to A33, wherein the communication path includes a single bidirectional communication path.

Clause A35. The storage method of any one of clauses A25 to A34, wherein the communication path includes two opposite unidirectional communication paths.

Clause A36. The storage method of any one of clauses A25 to A35, wherein the memory further includes a mode register (MR) in which a parameter list is stored so that at least the two dies (D1, D2) is set according to the parameter list.

Clause A37. The storage method of any one of clauses A25 to A36, further comprising controlling, by a memory controller connected to the two dies (D1, D2), the resistance value of the target on-die termination (T-ODT) in the target die (T-D).

Clause A38. The storage method of any one of clauses A25 to A37, further comprising controlling, by the controller, the resistance value of the non-target on-die termination (NT-ODT) in the non-target die (NT-D).

Clause A39. The storage method of any one of clauses A25 to A38, wherein the memory is a low power dual data rate (LPDDR) memory.

It should be noted that for the sake of brevity, the foregoing method embodiments are all described as a series of combinations of actions, but those skilled in the art should understand that the present disclosure is not limited by the described order of actions, because according to the present disclosure, some steps may be performed in other orders or at the same time. In addition, those skilled in the art should also understand that the embodiments described in the description are all optional embodiments, and the acts and units involved are not necessarily required by the present disclosure.

In the above described embodiments, descriptions of the various embodiments are focused differently, and portions that are not detailed in certain embodiments may be referred to related descriptions in other embodiments.

In several embodiments provided in the present disclosure, it will be appreciated that the disclosed device may be implemented in other manners. For example, the device embodiments described above are merely illustrative. For example, the division of the units is merely one type of logical functional division, and other dividing manners may be adopted in practical implementations. For example, a plurality of units or components may be combined or integrated into another system, or some features may be omitted, or not executed. In addition, the shown or discussed mutual coupling or direct coupling or communicative connection may be an indirect coupling or communicative connection via some interfaces, devices or units, or may be in an electrical, optical, acoustic, magnetic or other form.

The units described as separate parts may or may not be physically separate, and parts displayed as units may or may not be physical units, may be located in one position, or may be distributed on a plurality of network units. Some or all of the units may be selected according to actual needs to achieve the purpose of the solution of the embodiment.

In addition, functional units in various embodiments of the present disclosure may be integrated into one processing unit, or each unit may be provided separately and physically, or two or more units may be integrated into one unit. The integrated unit as described above may be implemented in the form of hardware, or in the form of a software program unit.

The integrated unit, if implemented in the form of a software program unit and sold or used as a stand-alone product, may be stored in a computer readable memory. Based on such understanding, the technical solution of the present disclosure may be embodied in the form of a software product, which is stored in a memory and includes several instructions for causing a computer device (which may be a personal computer, a server, or a network device, etc.) to perform all or part of the steps of the method according to the embodiments of the present disclosure. The memory mentioned before includes: a U disk, a read only memory (ROM), a random access memory (RAM), a mobile hard disk, a disk or compact disk, or any other medium that can store a program code.

It should be understood that the terms "first", "second", "third", "fourth", and the like in the claims, description, and drawings of the present disclosure are used to distinguish between different objects, and are not intended to describe a particular order. The terms "includes" and "including", when used in the description and claims of the present disclosure, specify the presence of stated features, integers, operations, operations, elements, and/or components, but do not preclude the presence or addition of one or more other features, integers, steps, operations, elements, components, and/or groups thereof.

It is also to be understood that the terminology used in the description of the disclosure herein is for the purpose of describing specific embodiments only, and is not intended to be limiting of the disclosure. As used in the description and the claims of the disclosure, the singular forms "a", "an" and "the" are intended to include the plural forms as well, unless the context clearly indicates otherwise. It should be further understood that the term "and/or" as used in the description and claims of the disclosure refers to any and all possible combinations of one or more of the associated listed items and includes such combinations.

As used in the description and the claims, the term "if" may be interpreted contextually as "when" or "once", or "in response to determining", or "in response to detecting." Similarly, the phrase "if it is determined" or "if [the described condition or event] is detected" may be interpreted contextually as "upon determining" or "in response to

What is claimed is:

1. A memory, comprising:
two dies (D1, D2) with respective on-die terminations (ODT1, ODT2), and a communication path provided between the two dies (D1, D2);
wherein one of the two dies is a target die (T-D), and the on-die termination (ODT1, ODT2) of the target die (T-D) is a target on-die termination (T-ODT); the other is a non-target die (NT-D), and the on-die termination (OTD2, ODT1) of the non-target die (NT-D) are a non-target on-die termination (NT-ODT); and an operation mode of the target die (T-D) includes a read mode and a write mode; and
the target die (T-D) sends a notification signal to the non-target die (NT-D) through the communication path to notify the non-target die (NT-D) of the operation mode of the target die (T-D), wherein the non-target die (NT-D) is configured to, in response to receiving the notification signal from the target die (T-D) and depending on different operation modes of the target die (T-D), set the non-target on-die termination (NT-ODT) to different resistance values;
wherein the notification signal is a step signal including a front step edge and a back step edge, the step signal is sent in the read mode, in which the front step edge of the step signal occurs before the start of data transmission in the read mode of the target die (T-D), and the back step edge occurs after the end of data transmission in the read mode of the target die (T-D).

2. The memory of claim 1, wherein a resistance value of the target on-die termination (T-ODT) is set to be no less than a resistance value of the non-target on-die termination (NT-ODT); and
the target on-die termination (T-ODT) is set to OFF.

3. The memory of claim 1, wherein the resistance value of the non-target on-die termination (NT-ODT) is set to be no less than 60 ohms in the read mode;
the non-target on-die termination (NT-ODT) is set to OFF in the read mode;
the resistance value of the non-target on-die termination (NT-ODT) is set to be no greater than 120 ohms in the write mode; and
the resistance value of the non-target on-die termination (NT-ODT) is set to be any value of 240/N ohms, where N is any integer from 2 to 10.

4. The memory of claim 1, further comprising:
a mode register (MR) in which a parameter list is stored, so that the memory is able to set at least the two dies (D1, D2) according to the parameter list;
a memory controller that is connected to the two dies (D1, D2) and configured to control the resistance value of the target on-die termination (T-ODT) in the target die (T-D), and further configured to control the resistance value of the non-target on-die termination (NT-ODT) in the non-target die (NT-D).

5. A processor system, comprising:
a processor chip; and
the memory of claim 1, in which the processor chip is connected to the dies (D1, D2),
wherein depending on different operation modes of the target die (T-D), the processor chip sets resistance values of the target on-die termination (T-ODT) and the non-target on-die termination (NT-ODT), and/or an on-die termination of the processor chip; and
the processor chip includes a CPU chip, a GPU chip, or an SoC chip.

6. The processor system of claim 5, wherein the on-die termination of the processor chip is set to be no greater than 120 ohms in a read mode;
the resistance value of the non-target on-die termination (NT-ODT) is set to 240/N, where N is an integer between 2 and 10; and
an on-die termination of the processor system is set to OFF in a write mode.

7. A storage method performed on a memory, wherein the memory comprises two dies (D1, D2) with respective on-die terminations (ODT1, ODT2), and a communication path is provided between the two dies (D1, D2); wherein one of the two dies is a target die (T-D), and the on-die termination (ODT1, ODT2) of the target die (T-D) is a target on-die termination (T-ODT); the other is a non-target die (NT-D), and the on-die termination (OTD2, ODT1) of the non-target die (NT-D) are a non-target on-die termination (NT-ODT); and an operation mode of the target die (T-D) includes a read mode and a write mode; and
the method comprises:
sending a notification signal to the non-target die (NT-D) through the communication path to notify the non-target die (NT-D) of the operation mode of the target die (T-D),
wherein in response to receiving the notification signal from the target die (T-D) and depending on different operation modes of the target die (T-D), the non-target die (NT-D) sets the non-target on-die termination (NT-ODT) to different resistance values;
wherein the notification signal is a step signal including a front step edge and a back step edge, the step signal is sent in the read mode, in which the front step edge of the step signal occurs before the start of data transmission in the read mode of the target die (T-D), and the back step edge occurs after the end of data transmission in the read mode of the target die (T-D).

8. The storage method of claim 7, wherein a resistance value of the target on-die termination (T-ODT) is set to be no less than a resistance value of the non-target on-die termination (NT-ODT); and
the target on-die termination (T-ODT) is set to OFF.

9. The storage method of claim 7, wherein the resistance value of the non-target on-die termination (NT-ODT) is set to be no less than 60 ohms in the read mode; and
the non-target on-die termination (NT-ODT) is set to OFF in the read mode;
the resistance value of the non-target on-die termination (NT-ODT) is set to be no greater than 120 ohms in the write mode; and
the resistance value of the non-target on-die termination (NT-ODT) is set to be any value of 240/N ohms, where N is any integer from 2 to 10.

10. The storage method of claim 7, wherein the memory further includes a mode register (MR) in which a parameter list is stored so that at least the two dies (D1, D2) are set according to the parameter list;

the storage method further comprises:

controlling, by a memory controller connected to the two dies (D1, D2), the resistance value of the target on-die termination (T-ODT) in the target die (T-D); and controlling, by the controller, the resistance value of the non-target on-die termination (NT-ODT) in the non-target die (NT-D).

\* \* \* \* \*